United States Patent [19]

Woods et al.

[11] Patent Number: 4,985,674

[45] Date of Patent: Jan. 15, 1991

[54] REAL TIME, HOSTILE ENVIRONMENT, MEMORY TESTER INTERFACE

[75] Inventors: Ralf D. Woods, Corona; Brent D. Hooker, La Habra, both of Calif.

[73] Assignee: Rockwell International Corporation, El Segundo, Calif.

[21] Appl. No.: 422,317

[22] Filed: Oct. 16, 1989

[51] Int. Cl.$^5$ .................. G01R 19/00; G01R 1/00; H03K 17/60

[52] U.S. Cl. .................. 324/158 R; 324/73.1; 307/475; 371/21.1

[58] Field of Search .................. 324/158 R, 73.1, 126; 371/21.1, 22.1; 365/185, 201, 200; 307/475

[56] References Cited

U.S. PATENT DOCUMENTS

| | | | |
|---|---|---|---|
| 3,585,399 | 6/1971 | Andrews, Jr. | 307/475 |
| 3,602,741 | 8/1971 | Ressler et al. | 307/475 |
| 3,953,748 | 4/1976 | Sugiura et al. | 307/475 |
| 4,291,404 | 9/1981 | Steiner | 371/22.1 |
| 4,570,262 | 2/1986 | Barbknecht et al. | 371/22.1 |
| 4,908,576 | 3/1990 | Jackson | 324/158 R |
| 4,928,062 | 5/1990 | Miles et al. | 324/158 R |

Primary Examiner—Reinhard J. Eisenzopf
Assistant Examiner—Vinh P. Nguyen
Attorney, Agent, or Firm—H. Fredrick Hamann; George A. Montanye; Tom Streeter

[57] ABSTRACT

An interface between a memory tester and a memory includes, in order, an inverter and digital line driver, a short section of coaxial cable, an impedance matching resistor, a level shifter (which may be omitted if the tester and the memory operate at a common voltage), an analog line driver, a long section of coaxial cable, and a final impedance matching resistor. Very high frequency memory interrogation is supported.

6 Claims, 3 Drawing Sheets

REAL TIME, HOSTILE ENVIRONMENT, MEMORY TESTER INTERFACE

This invention was made with Government support under Contract No. F04704-87-C-0077 awarded by the Air Force. The Government has certain rights in this invention.

BACKGROUND OF THE INVENTION

The memory of a computer is often subjected to a hostile environment: neutrons, gamma radiation, heat, shock, and the like. It is important to know how well the memory has retained its information. It is therefore important to be able to test the memory after it has failed. The tester, however, should not be in the hostile environment. The partially damaged memory is therefore removed from the hostile environment and plugged into the tester in a benign environment.

This test method is not entirely satisfactory. For one thing, it is necessary for some one or some thing to enter the hostile environment in order to remove the memory, and this is, by definition, unsafe. For another, the tester can determine which bits of the memory have undergone permanent damage, but temporary damage evaluation is beyond its capability. For a third, the tester is unable to determine exactly what the status of each of a fairly large number of bits is, microsecond by microsecond, as an environmental assault (such as, for example, a shock wave) passes through the memory.

It is possible to place the tester at a remote location, so that it will not be subjected to the same hostile environment or assault, and to test the memory as the assault passes through the memory. However, a long cable must then be extended from the memory to the tester, and this causes problems in itself. The output signals of the typical computer memory were never intended to be sent over great distances, but only to the next chip, or to the next circuit board at the most. The output signals are therefore degraded in and by the cable, and the tester cannot extract as much meaningful information as is desired.

SUMMARY OF THE INVENTION

It is an objective of the present invention to provide an interface between a tester and a remote memory under test in a hostile environment, so that the tester can get real time data from at least a portion of the memory as an environmental assault passes through that portion.

It is a further objective of the present invention to provide such an interface with the capacity to completely test even a fairly large memory within a reasonably short time after an environmental assault has occurred.

It is a further objective of the present invention to provide such an interface with the capacity to test the memory in place, in the hostile environment, without endangering man and machinery to recover the memory from the hostile environment.

It is an advantage of the present invention that memories made from a wide variety of technologies can be tested with a single interface, since the interface will accept voltages at any reasonable level.

It is a further advantage of the present invention that, with a suitable selection of components, a cable of any reasonable impedance can be used.

It is a further advantage of the present invention that it can be made compact and lightweight.

It is a further advantage of the present invention that both serial and parallel testers can be supported.

BRIEF DESCRIPTION OF THE DRAWINGS

These and other objectives and advantages will become apparent with reference to the following drawing, in which.

DETAILED DESCRIPTION OF THE DRAWINGS

Figure 1:
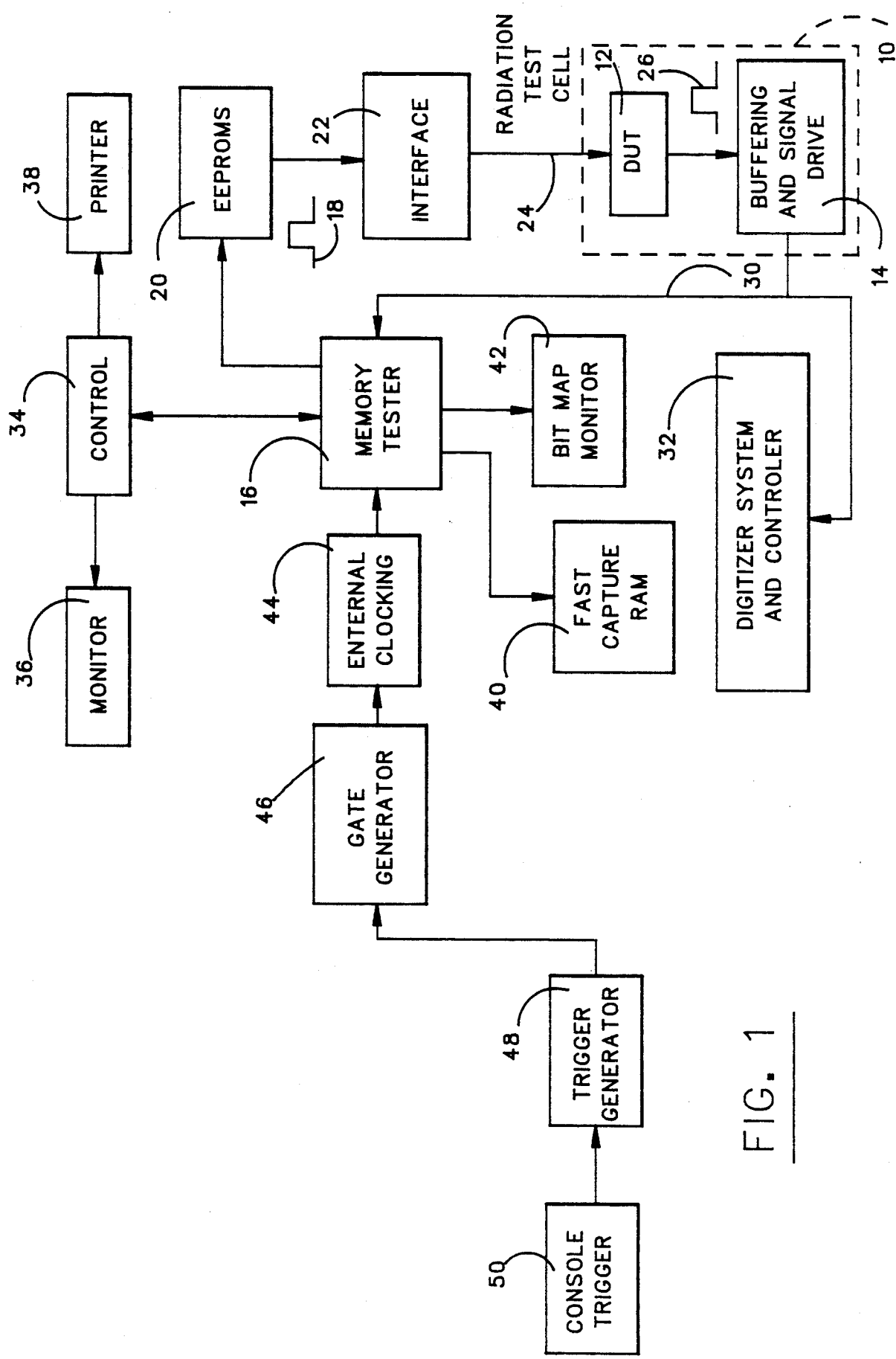
FIG. 1 is an overall block drawing of a test configuration utilizing the present invention.

Turning now to FIG. 1, a radiation test cell 10 contains a device under test ("DUT") 12 and a buffering and signal drive 14. The radiation test cell 10 is a typical hostile environment for a memory, and "radiation test cell" should be construed as including any continuing or transient hostile environment. Likewise, the device under test 12 is generally a memory, and will be referred to as such throughout the present description, but "memory" and "device under test" should be construed as including any device with a plurality of components, the state of each of which is desired to be known while the device is in a continuing or transient hostile environment.

A memory tester 16, outside the radiation test cell 10, sends input signals 18 to a plurality of address pseudo-randomizing EEPROMs 20, if address pseudorandomizing is desired. Address pseudorandomizing is preferred by Applicants. For the memory tester 16, Applicants prefer to use the MOSAID MS2200 Memory Test System. The input signals 18 then enter the wide band amplifier, level shifter, and buffer (all herein called the interface) 22, described in greater detail in FIG. 3. The input signals 18 then pass through a first cable 24, preferably fifty ohm coaxial, and enter the memory 12.

Inside the memory 12, the input signals 18 are converted to output signals 26, are passed through the buffering and signal drive 14 (also in the radiation test cell 10), and are transmitted over a second cable 30, also preferably fifty ohm coaxial, out of the radiation test cell 10 and back to the memory tester 16. They are also transmitted to a digitizer system and controller 32, preferably a Textronix 7912AD.

From the memory tester 16, the results are passed to a controller 34, preferably an AST 80286, from which they may be displayed on a monitor 36, a printer 38, or both. The results are also passed to a fast capture RAM 40 and a real time bit monitor 42.

In FIG. 1, the memory tester 16 is controlled not only by the controller 34, but also by external clocking 44, which is in turn controlled by a gate generator 46. The gate generator 46 is in turn controlled by a trigger generator 48, which is in turn controlled by a console trigger 50.

Figure 2:
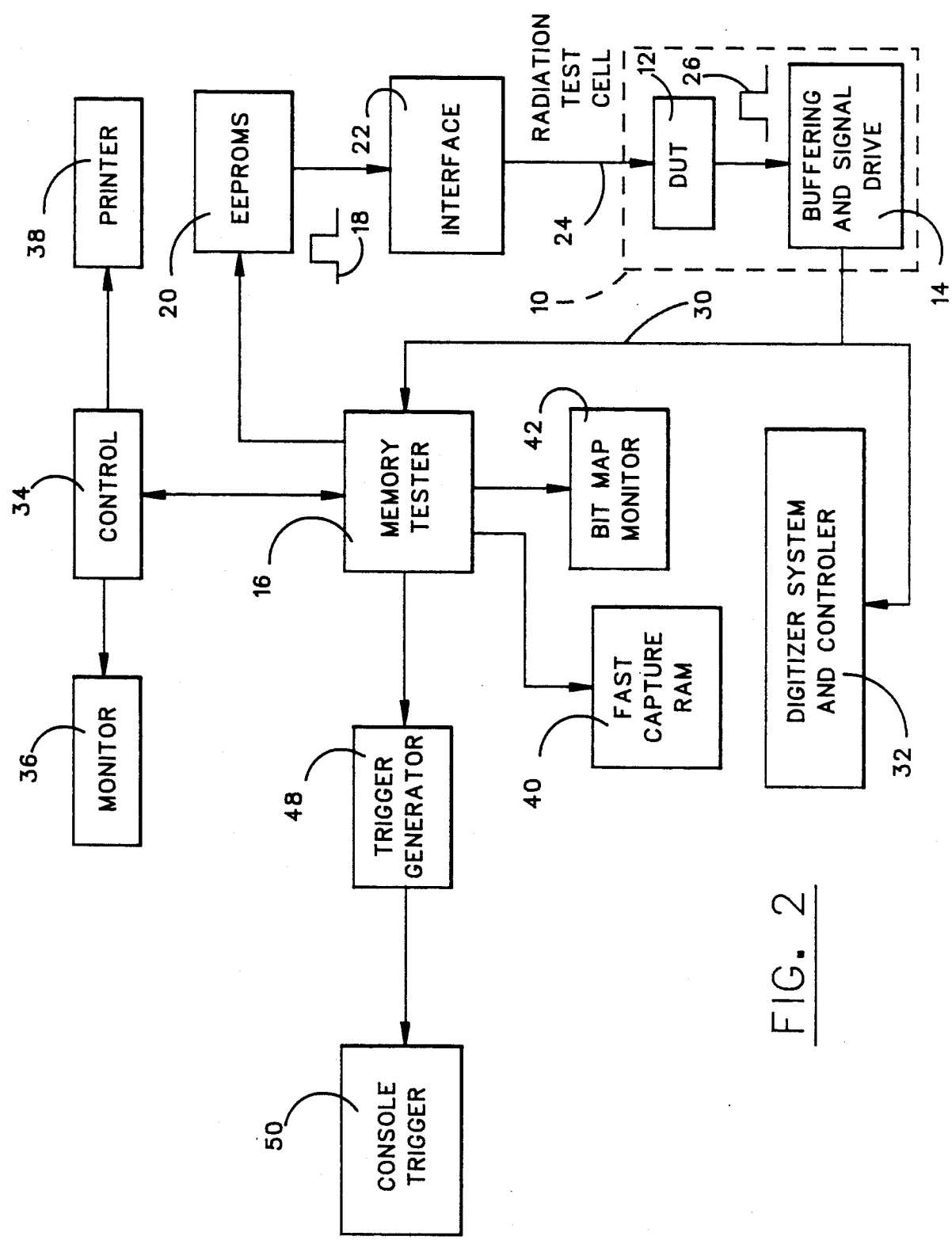
FIG. 2 is similar to FIG. 1 and shows an alternative configuration.

In FIG. 2 the memory tester 16 drives the trigger generator 48.

Figure 3:
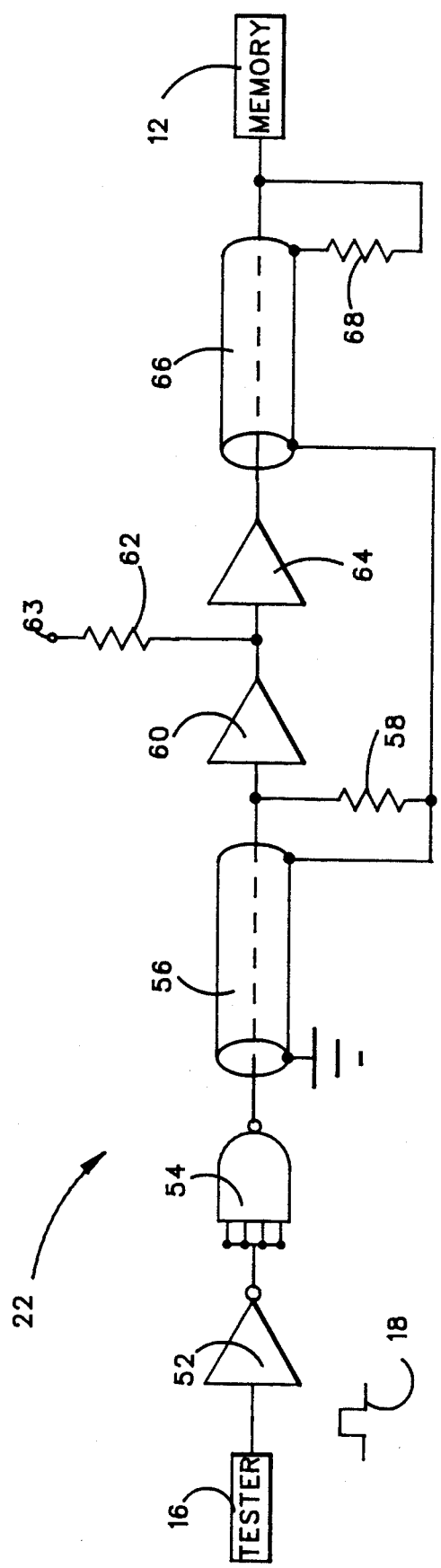
FIG. 3 is a schematic drawing of an embodiment of the present invention.

Turning now to FIG. 3, the interface 22 is shown in greater detail. Signals 18 from the tester 16 pass through an inverter 52, preferably a 7404, and then into a four-input NAND gate line driver 54, preferably a 74S140. This combination of components is placed in the path of the signals 18 to guarantee that the signals 18 will maintain TTL voltage levels in the following first three foot section 56 of RG-59 coaxial cable, which has a first fifty ohm resistor 58 connected across its terminals at the distal end. Were it not for this combination, the TTL voltage level outputted by the tester 16 would be dissipated to less than TTL voltage levels by the coax 56; that is, the combination is an impedance match between the tester 16 and the first coax 56.

At this point, the signals 18 enter a digital open collector level shifter 60, preferably a 7407. The output of the shifter 60 is attached to one end of a pull-up resistor 62, the other end of which is attached to a source 63 of level shifting voltage. The output of the shifter 60 is also attached to an analog line driver 64, preferably an LH0063C. The output of the line driver 64 is attached to one end of a second section 66 of RG-59 coaxial cable. Applicants have obtained good results with up to one hundred feet of coax 66, and have no reason to believe that longer sections would not be operable. A second fifty ohm resistor 68 is attached across the terminals of the distal end of the coax 66. The line driver 64 generates sufficient current through the coax 66 as to create a level shifted voltage drop across the proximal end of the coax 66 (at the output of the driver 64), and, thus, at the distal end of the coax 66, across the second resistor 68.

The net result of this compact and lightweight apparatus is an input signal 18 to the memory 12 with many desirable characteristics.

First, the signal 18 entering the memory 12 has the same width as the signal 18 produced by the memory tester 12.

Second, the signal 18 entering the memory 12 has the same rise time as the signal 18 produced by the level shifter 60. This is very fast, of no more than 10 nanoseconds, and 5 nanoseconds is typical. This short rise time, coupled with the above-described accurate pass through of pulse width, allows the memory 12 to be interrogated at very high frequencies. With the components described above, frequencies up to 25 megahertz can be supported.

Third, the signal 18 entering the memory 12 has the same voltage as the (arbitrarily selected) level shifting voltage source 63. It has this voltage regardless of the fact that the tester 16 was not designed to interface with coax, and regardless of the fact that the tester 16 produces voltage levels which may be useless to the memory 12 under test.

If the tester 16 has a large number of output ports, each with its own signal 18, a comparably large number of interfaces 22 can be used to provide the correct signals 18 to the memory 12. The tester 16 can therefore interrogate, over the interfaces 22, in parallel, as many bits of the memory 12 as it could with the memory 12 plugged directly into the tester 16. Thus, real time evaluation of the state of a fairly large number of bits of the memory 12 may be obtained as an environmental assault passes through the memory 12.

If the environmental assault is of sufficiently long duration, and if the tester 16 has multiplexing capability, then each of an even larger number of bits in the memory 12 may be examined by the tester 16, serially, over the interfaces 22. This mode of operation gives up the continuous or very closely spaced interrogations of the parallel mode of operation, but, as noted above, somewhat less closely spaced interrogations may be entirely adequate for the test at hand.

It is sometimes desired to subject the memory 12 to repeated environmental assaults, and to examine how well each and every bit of the memory survived each assault. In such cases, it is often not necessary to discover the microsecond-by-microsecond state of any of the bits as the assault passes through the memory 12, but only the final, post-assault state. It is apparent that the foregoing parallel mode of operation can be expanded to include an examination of the entire memory between assaults. Since it is not necessary, as in the prior art, to remove the memory 12 from the hostile environment 10, test it, and then replace it in the hostile environment 10, it may be subjected to repeated assaults at much shorter intervals that in the prior art, thereby maintaining the appropriateness of the "real time" label.

It is sometimes desired to assault the memory 12 only when it is in a particular configuration. This configuration may be dynamic, that is, the memory 12 must be passing through a specified sequence of states as the assault passes through it. Timing the assault has been difficult in the prior art. The present invention greatly simplifies this timing problem. The tester 16, upon discovering that the specified sequence has begun, can trigger the assault producing apparatus at just the right time. This "triggering right time" is selected such that, after adjusting for any lag between triggering and arrival, the assault passes through the memory 12 at just the right time.

It is apparent that the components of the interface 22, exclusive of the coaxial cables 66, are compact and lightweight. The coaxial cables 66 are necessarily present in any remote testing apparatus and generally may be conveniently obtained at the test site. The remaining components may be assembled at any convenient assembly facility, and may then be transported, in their assembled configuration, by hand or by light vehicle to the test site.

The components stated are suitable for use with coaxial cable of the impedance stated, namely, fifty ohms. Fifty ohms was selected as a commonly used impedance, but it is apparent that, if use of a cable of a difference impedance is desired, the components stated could be replaced by like components with different operating ranges without departing from the scope of the present invention.

Industrial Applicability

The present invention is capable of exploitation in industry, and can be used, whenever it is desired to test a memory in a hostile environment with real time results. The invention is capable of being made out of conventional components, or their non-conventional analogs.

While a particular embodiment of the present invention has been described in the foregoing detailed description, the true spirit and scope of the invention is not defined thereby, but by the appended claims.

What is claimed is:

1. An interface between an output of a memory tester and an input of a memory, comprising:
   (a) an inverter having an input and an output, the input being connected to the output of the memory tester;
   (b) a digital line driver having an input and an output, the input of the line driver being connected to the output of the inverter;
   (c) a first coaxial cable, having an internal conductor and an external conductor, having an input end and an output end, the external conductor being grounded, and the internal conductor input end being connected to the output of the line driver;
(d) a first resistor connected between the output end of the first cable internal conductor and the first cable external conductor;
(e) an analog line driver having an input and an output, the input being connected to the output end of the first cable internal conductor;
(f) a second coaxial cable, having an internal conductor and an external conductor, having an input end and an output end, the external conductor being grounded, the internal conductor input end being connected to the output of the analog line driver, and the internal conductor output end being connected to the input of the memory; and
(g) a second resistor connected between the output end of the second cable internal conductor and the second cable external conductor.

2. The interface of claim 1, wherein the line driver comprises a four-input NAND gate, the four inputs being connected together to form the line driver input.

3. An interface between an output of a memory tester and an input of a memory, comprising:
(a) an inverter having an input and an ouput, the input being connected to the output of the memory tester;
(b) a digital line driver having an input and an output, the input of the line driver being connected to the output of the inventer;
(c) a first coaxial cable, having an internal conductor and an external conductor, having an input end and an output end, the external conductor being grounded, and the internal conductor input end being connected to the output of the line driver;
(d) a first resistor connected between the output end of the first cable internal conductor and the first cable external conductor;
(e) a level shifter having an input and an output, the level shifter input being connected to the output end of the first cable internal conductor;
(f) a pull-up resistor connected between the output of the shifter and a level shifting voltage source;
(g) an analog line driver having an input and an output, the input being connected to the output of the level shifter;
(h) a second coaxial cable, having an internal conductor and an external conductor, having an input end and an output end, the external conductor being grounded, the internal conductor input end being connected to the output of the analog line driver, and the internal conductor output end being connected to the input of the memory; and
(i) a second resistor connected between the output end of the second cable internal conductor and the second cable external conductor.

4. The interface of claim 3, wherein the line driver comprises a four-input NAND gate, the four inputs being connected together to form the line driver input.

5. The interface of claim 4, wherein the level shifter comprises a digital open collector level shifter.

6. The interface of claim 3, wherein the level shifter comprises a digital open collector level shifter.

* * * * *